(12) United States Patent
Choi et al.

(10) Patent No.: US 7,960,984 B2
(45) Date of Patent: Jun. 14, 2011

(54) SEMICONDUCTOR DEVICE HAVING ESD PROTECTION CIRCUIT AND METHOD OF TESTING THE SAME

(75) Inventors: Young-Don Choi, Seoul (KR); Hoe-Ju Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 104 days.

(21) Appl. No.: 12/232,592

(22) Filed: Sep. 19, 2008

(65) Prior Publication Data

US 2009/0085599 A1    Apr. 2, 2009

(30) Foreign Application Priority Data

Sep. 20, 2007 (KR) .................. 10-2007-0095685

(51) Int. Cl.
*G01R 31/3187* (2006.01)
(52) U.S. Cl. .................. 324/750.3; 324/762.01
(58) Field of Classification Search .................. 324/763, 324/158.1
See application file for complete search history.

(56) References Cited

U.S. PATENT DOCUMENTS

| | | | |
|---|---|---|---|
| 5,703,747 A | 12/1997 | Voldman et al. | |
| 6,286,115 B1 * | 9/2001 | Stubbs | 714/718 |
| 6,734,693 B2 * | 5/2004 | Nakayama | 324/763 |
| 6,897,674 B2 * | 5/2005 | Braceras et al. | 324/765 |
| 6,963,212 B2 * | 11/2005 | Brown | 324/763 |
| 7,010,722 B2 * | 3/2006 | Jahnke | 714/30 |
| 7,057,395 B1 * | 6/2006 | Williamson | 324/519 |
| 7,115,442 B2 * | 10/2006 | Baik et al. | 438/112 |
| 7,148,563 B2 | 12/2006 | So et al. | |
| 7,171,596 B2 * | 1/2007 | Boehler | 714/718 |
| 2001/0052783 A1 * | 12/2001 | Schmid et al. | 324/763 |
| 2002/0190742 A1 * | 12/2002 | Ooishi | 324/763 |
| 2006/0087021 A1 | 4/2006 | Hirose | |
| 2007/0229106 A1 * | 10/2007 | Kelkar et al. | 324/763 |
| 2007/0257693 A1 * | 11/2007 | Stott et al. | 324/763 |

FOREIGN PATENT DOCUMENTS

| | | |
|---|---|---|
| JP | 08-250643 | 9/1996 |
| JP | 2005-064355 | 3/2005 |
| JP | 2006-120812 | 5/2006 |
| KR | 1020060052876 | 5/2006 |

* cited by examiner

*Primary Examiner* — Ha Tran T Nguyen
*Assistant Examiner* — Richard Isla Rodas
(74) *Attorney, Agent, or Firm* — Harness, Dickey & Pierce

(57) ABSTRACT

A semiconductor device having an electrostatic discharge (ESD) protection circuit and a method of testing the same may provided. The semiconductor device may include one or more stacked chips, each stacked chip may include a test circuit configured to output a test control signal and a selection control signal in response to a test enable signal, an internal circuit configured to perform an operation and output a plurality of test signals in response to the test control signal, at least one multiplexer (MUX) configured to select and output one of the plurality of test signals based on the selection control signal, at least one test pad configured to receive the selected test signal, and at least one electrostatic discharge (ESD) protection circuit configured to discharge static electricity applied through the test pad externally.

19 Claims, 2 Drawing Sheets

SEMICONDUCTOR DEVICE HAVING ESD PROTECTION CIRCUIT AND METHOD OF TESTING THE SAME

PRIORITY STATEMENT

This application claims the benefit of Korean Patent Application No. 10-2007-0095685, filed Sep. 20, 2007, the disclosure of which is hereby incorporated herein by reference in its entirety.

SUMMARY

Example embodiments may provide a semiconductor device having an electrostatic discharge (ESD) protection circuit that may reduce the number of test pads for a test and electrostatic discharge (ESD) protection circuits and thus reduce attenuation of internal signals. Example embodiments may also provide a method of testing the semiconductor device having an electrostatic discharge (ESD) protection circuit.

Example embodiments may provide a semiconductor device including one or more stacked chips, each stacked chip including a test circuit, an internal circuit, at least one multiplexer (MUX), at least one test pad and/or at least one electrostatic discharge (ESD) circuit. The test circuit may be configured to output a test control signal and a selection control signal in response to a test enable signal. The internal circuit may be configured to perform an operation and output a plurality of test signals in response to the test control signal. The at least one Multiplexer (MUX) may be configured to select and output one of the plurality of test signals based on the selection control signal. The at least one test pad may be configured to receive the selected test signal. The at least one electrostatic discharge (ESD) protection circuit may be configured to discharge static electricity applied through the test pad externally.

According to example embodiments, each stacked chip may further include a selection signal generator configured to output a selection signal in response to the selection control signal. The at least one Multiplexer (MUX) may be configured to select and output one of the plurality of test signals in response to the selection signal.

According to example embodiments, each stacked chip may further include an interface configured to receive the plurality of test signals from the internal circuit and to one of drive and output the test signals and prevent the test signals from being output in response to an interface control signal. The test circuit may output the interface control signal in response to the test enable signal.

According to example embodiments, each stacked chip may further include a plurality of transmission lines configured to electrically connect the one or more stacked chips to at least one other chip.

According to example embodiments, the semiconductor device may further include an interface chip configured to receive the test signals applied from the one or more stacked chips through the plurality of transmission lines and output the test signals externally.

According to example embodiments, the interface chip may further include a test control circuit configured to output the test enable signal, a final selection control signal, and a chip control signal to control the selection signal generator of each of the stacked chips when the semiconductor device performs a test operation. The interface chip may further include at least one interface MUX configured to select and output one of the test signals applied from each of the one or more stacked chips through the plurality of transmission lines based on the final control selection signal, at least one test interface pad configured to receive the selected test signal, and/or at least one interface ESD protection circuit configured to discharge static electricity applied through the test interface pad externally.

According to example embodiments, the interface chip may further include a final selection signal generator configured to output a final selection signal in response to the final selection control signal. The at least one interface MUX is configured to select and output one of the test signals applied from each of the one or more stacked chips through the plurality of transmission lines in response to the final selection signal.

According to example embodiments, the interface chip may sequentially activate only one of the interfaces of the one or more stacked chips to receive the outputted test signals, with the interfaces of the other one or more stacked chips being deactivated.

According to example embodiments, the interface chip may further includes a plurality of buffers configured to buffer the test signals applied through the plurality of transmission lines and output the plurality test signals to the at least one interface MUX.

According to example embodiments, the interface chip may further include at least one test pin electrically connected with the test interface pad to output the test signal applied to the test interface pad externally.

According to example embodiments, each of the stacked chips may further include a plurality of buffers configured to buffer the test signals applied through the interface and output the test signals to the at least one MUX.

According to example embodiments, each of the stacked chips may include at least one test pin electrically connected with the at least one test pad to output the selected test signal applied to the test pad externally.

According to example embodiments, the semiconductor device may have the at least one test pad correspond to the at least one MUX and the at least one ESD protection circuit between the MUX and the test pad.

Example embodiments may provide a method of testing a semiconductor device including one or more chips. The method may include generating a test control signal, a selection control signal, and an interface control signal, in response to a test enable signal, performing an operation in response to the test control signal and outputting a plurality of test signals, receiving, driving and outputting the test signals based on the interface control signal, selecting at least one of the test signals in response to the selection control signal and outputting the selected test signal, and/or transmitting the selected test signal to at least one test pad through at least one ESD protection circuit.

According to example embodiments the method may further include generating a selection signal in response to the selection control signal, and selecting one the test signals in response to the selection signal and outputting the selected test signal.

According to example embodiments the method may further include generating the test enable signal and a chip control signal in response to a test command applied externally, preventing the plurality of test signals from at least one of the chips from being applied to the respective ESD protection circuit and the test pad in response to the chip control signal, receiving a plurality of the test signals from one of the one or more chips, selecting at least one of the test signals, and outputting the finally selected test signal, and/or transmitting the finally selected test signal to a test interface pad through an interface ESD protection circuit.

According to example embodiments the preventing may further include preventing the plurality of test signals from at least one of the chips from being applied to the respective ESD protection circuit and the test pad in response to the interface control signal. The receiving may further includes buffering and outputting the driven test signals from one of the one or more chips.

According to example embodiments the receiving of the plurality of the test signals may include generating a final selection control signal, generating a final selection signal to select one of the test signals in response to the final selection control signal, and selecting and outputting one of the plurality of test signals in response to the final selection signal.

Example embodiments may provide a method performing an operation in response to a test control signal and outputting a plurality of test signals, selectively preventing at least one of the outputted test signals from being applied to at least one (ESD) protection circuit, and transmitting any one of the outputted test signals received to at least one test pad through at least one of the ESDs.

BRIEF DESCRIPTION OF THE DRAWINGS

The foregoing and other objects, features and advantages of example embodiments will become more apparent by describing in detail example embodiments thereof with reference to the attached drawings in which.

DETAILED DESCRIPTION

Figure 1:
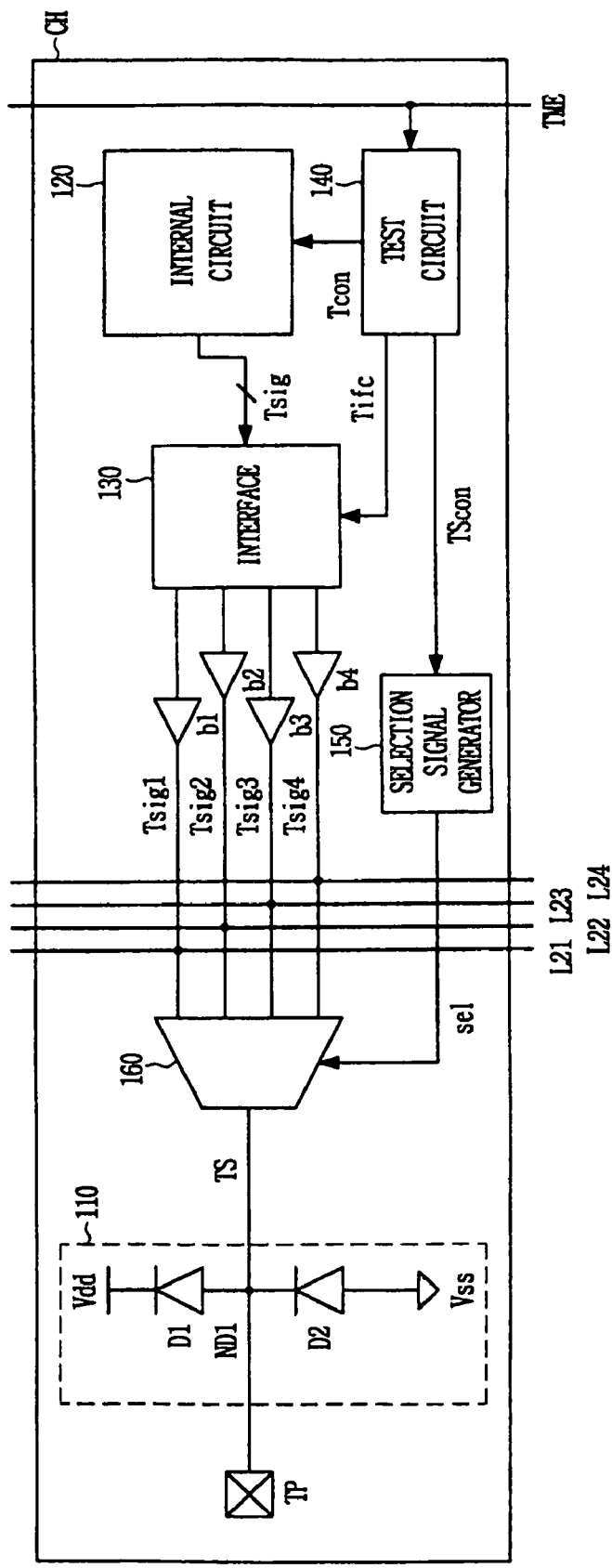
FIG. 1 is a circuit diagram of a chip of a semiconductor device according to example embodiments.

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

FIG. 1 is a circuit diagram of a chip of a semiconductor device according to example embodiments. In particular, FIG. 1 illustrates a chip CH of a multi-chip package (MCP) semiconductor device.

A test circuit 140 outputs a test control signal Tcon for testing an internal circuit 120 in response to a test enable signal TME applied for a test. The test enable signal TME indicates the start of a test, and may be applied externally. The test circuit 140 outputs an interface control signal Tifc for indicating an operation status.

The internal circuit 120 performs a predetermined operation and output a test signal Tsig in response to the test control signal Tcon. For example, when the chip CH to be tested is a memory chip, data stored in a memory cell may be output as the test signal Tsig.

The interface 130 drives and outputs the test signal Tsig applied from the internal circuit 120 in response to the interface control signal Tifc applied from the test circuit 140. The interface control signal Tifc may indicate whether the chip CH is in a test operation or a normal operation.

Buffers b1 to b4 buffer test signals Tsig1 to Tsig4 applied from the interface 130 and output the test signals Tsig1 to Tsig4 to a Multiplexer (MUX) 160.

In response to a selection signal sel applied from a selection signal generator 150, the MUX 160 may select one of the test signals Tsig1 to Tsig4 and output the selected test signal TS to a test pad TP. Here, the test signals Tsig1 to Tsig4 may be all or some of signals output from the internal circuit 120. Even in a test, all the signals output from the internal circuit 120 may not need to be tested. When the chip CH to be tested is the chip of a single-chip package semiconductor device, the internal circuit 120 may output an external input/output signal. In a single-chip package semiconductor device, an external input/output signal may not require the test pad TP because a pad corresponding to the external input/output signal and an electrostatic discharge (ESD) protection circuit 110 may be included in the chip CH. In an MCP semiconductor device, a plurality of chips each may have the ESD protection circuit 110 and a pad directly connected with an external pin. Therefore, signals corresponding to the pad included in the chip CH among the signals output from the internal circuit 120 may not need to be output through the test pad TP. Consequently, in FIG. 1, the MUX 160 is configured to receive only the test signals Tsig1 to Tsig4 among the signals output from the internal circuit 120, which may not need to be tested but require the additional test pad TP and the ESD protection circuit 110 because they are not directly output from the chip CH after packaging.

In addition, the MUX 160 may not select the test signals Tsig1 to Tsig4 when the chip CH is not in the test operation. For example, the MUX 160 may prevent the selected test signal TS from being output in the normal operation. Thus, the test signals Tsig1 to Tsig4 may not be applied to the ESD protection circuit 110, and the load of the test signals Tsig1 to Tsig4 may be reduced. Consequently, it may be possible to reduce signal attenuation.

In FIG. 1, only one each of the MUX 160, the test pad TP and the ESD protection circuit 110 may be included in the chip CH. However, there may be a plurality of test signals. In this case, only one MUX 160 may select and output all of the test signals, and test time may increase. Thus, a plurality of MUXs, test pads and/or ESD protection circuits may also be included in the chip CH.

The selection signal generator 150 may output the selection signal sel in response to a selection control signal TScon applied from the test circuit 140. Alternatively, the test circuit 140 may be configured to output the selection signal sel instead, and the selection signal generator 150 may be omitted.

Transmission lines L21 to L24 may electrically connect a plurality of chips in an MCP semiconductor device. Therefore, when the chip CH is a single-chip package semiconductor device, not all of the transmission lines L21 to L24 may be included.

The operation of testing a chip of a semiconductor device will be described with reference to FIG. 1. First, when a test enable signal TME is applied from the outside of the chip CH, the test circuit 140 outputs a test control signal Tcon, an interface control signal Tifc and a selection control signal TScon in response to the test enable signal TME. The internal circuit 120 outputs a test signal Tsig in response to the test control signal Tcon. In response to the interface control signal Tifc, the interface 130 drives the test signal Tsig and output test signals Tsig1 to Tsig4. When the semiconductor device does not perform the test operation, the interface 130 prevents the test signals Tsig1 to Tsig4 from being output.

The selection signal generator 150 outputs a selection signal sel for selecting one of the test signals Tsig1 to Tsig4 in response to the selection control signal TScon. The MUX 160 receiving the test signals Tsig1 to Tsig4 selects one of the test signals Tsig1 to Tsig4 in response to the selection signal sel and outputs the selected test signal TS. The selected test signal TS passes through the ESD protection circuit 110 and is output to the test pad TP. After the selected test signal TS is tested, the selection signal generator 150 may output the selection signal sel such that the MUX 160 selects another one of the test signals Tsig1 to Tsig4. When the test is completed, the test circuit 140 may output the selection control signal TScon to the selection signal generator 150, and the selection signal generator 150 may output the selection signal sel in response to the selection control signal TScon such that the MUX 160 does not select the any of the test signals Tsig1 to Tsig4. When the test operation is not performed, the interface 130 may not output the test signals Tsig1 to Tsig4 and the MUX 160 may not select from any of the test signals Tsig1 to Tsig4. Thus, none of the test signals Tsig1 to Tsig4 may be applied to the ESD protection circuit 110. However, the interface 130 may drive and output other signals output from the internal circuit 120 not including the test signals Tsig1 to Tsig4 even if the test operation is not performed. For example, while it is illustrated in FIG. 1 that the interface 130 receives only the test signals Tsig, the interface 130 may receives signals other than the test signals Tsig from the internal circuit 120, and then drive and output those received signals.

The chip CH of FIG. 1 may not have individual test pads for the respective test signals Tsig1 to Tsig4. However, the chip CH of FIG. 1 may need to be tested. Here, the MUX 160 may be prepared for the test signals Tsig1 to Tsig4, which may not be output from the chip CH after packaging, and may be configured to selectively output the test signals Tsig1 to Tsig4, so that the number of test pads may be reduced. Since the number of test pads may be reduced, the number of ESD protection circuits corresponding to the test pads also may also be reduced. Therefore, the size of the chip CH may be reduced. In addition, when the test operation is not performed, the MUX 160 may not select the test signals Tsig1 to Tsig4, and the test signals Tsig1 to Tsig4 may not be applied to the ESD protection circuit 110. Thus, it may be possible to prevent signal attenuation.

Figure 2:
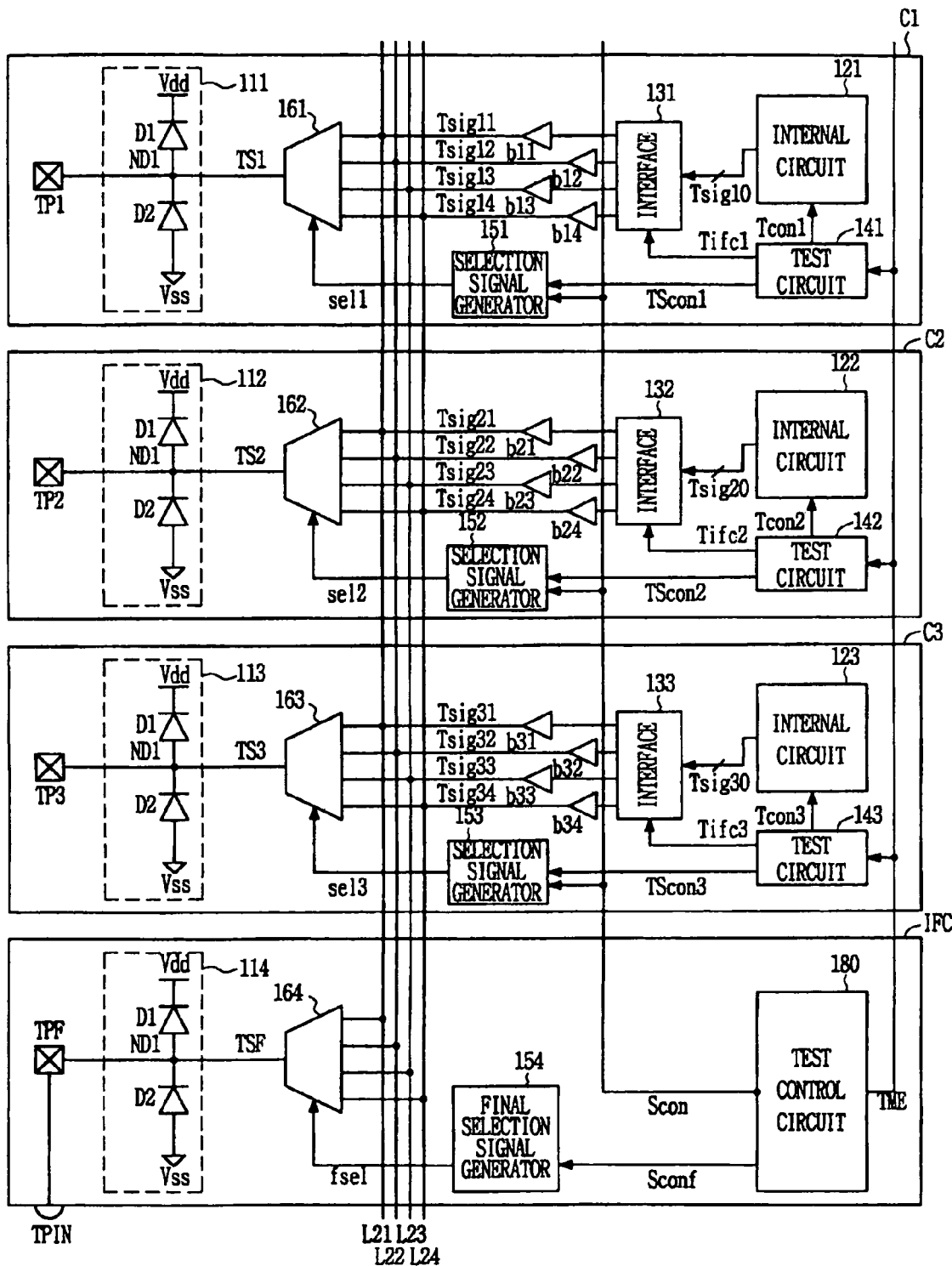
FIG. 2 is a circuit diagram of an MCP semiconductor device according to example embodiments.

FIG. 2 is a circuit diagram of an MCP semiconductor device according to example embodiments, showing a stack-type semiconductor device in which three chips C1 to C3 are stacked. In FIG. 2, the chip CH of FIG. 1 may be embodied as the respective chips C1 to C3. As illustrated in FIG. 2, the respective chips C1 to C3 have MUXs 161 to 163, and the MUXs 161 to 163 selectively output test signals Tsig11 to Tsig34. Therefore, the number of test pads TP1 to TP3 and the number of ESD protection circuits 111 to 113 may be reduced. However, the test pads TP1 to TP3 and the ESD protection circuits 111 to 113 included in the respective chips C1 to C3 may not be used after packaging. In the MCP semiconductor device of FIG. 2, an interface chip IFC may receive the test signals Tsig11 to Tsig34 from the chips C1 to C3 and may select and output one of the test signals Tsig11 to Tsig34 to the outside. Thus, the MCP semiconductor device may be tested after packaging.

Each of the chips C1 to C3 may be constituted as shown in FIG. 1 except that selection signal generators 151 to 153 of the respective chips C1 to C3 may control the corresponding MUXs 161 to 163 in response to a chip control signal Scon applied from a test control circuit 180 of the interface chip IFC as well as selection control signals TScon1 to TScon3 applied from test circuits 141 to 143.

The interface chip IFC may have a test control circuit 180 for controlling a test operation of the entire MCP semiconductor device, an interface MUX 164 for selecting one of the test signals Tsig11 to Tsig34 applied from the chips C1 to C3 and outputting the selected test signal to a test interface pad TPF, and a final selection signal generator 154 for controlling the interface MUX 164. In the interface chip IFC, while only one interface MUX is illustrated, a plurality of interface MUXs may be used in example embodiments.

In the test operation, the test control circuit 180 outputs the test enable signals TME to the plurality of chips C1 to C3. The respective test circuits 141 to 143 output test control signals Tcon1 to Tcon3, interface control signals Tifc1 to Tifc3 and the selection control signals TScon1 to TScon3 in response to the test enable signals TME. In some cases, the test enable signals TME applied to the respective test circuits 141 to 143 may be distinguished from each other. When the distinguishable test enable signals TME are output, it may be possible to separately test the respective chips C1 to C3. When the respective chips C1 to C3 are separately tested, they may be tested under the same conditions as at a wafer level. Internal circuits 121 to 123 may output test signals Tsig10, Tsig20 and Tsig30 in response to the test control signals Tcon1 to Tcon3, respectively.

In response to the interface control signals Tifc1 to Tifc3, respective interfaces 131 to 133 drive the test signals Tsig10 to Tsig30 and output the test signals Tsig11 to Tsig34. Since the test signals Tsig11 to Tsig34 output from the interfaces 131 to 133 may be applied to transmission lines L21 to L24 in common, only one of the interfaces 131 to 133 may output test signals. To this end, only one of the interfaces 131 to 133 may be selectively activated in response to the interface control signals Tifc1 to Tifc3 and outputs test signals. However, the interfaces 131 to 133 may receive an additional control signal from the test control circuit 180 and output the test signals Tsig11 to Tsig34.

The selection signal generators 151 to 153 output selection signals sel1 to sel3 in response to the interface control signals Tifc1 to Tifc3 and the chip control signal Scon. As described above, the test pads TP1 to TP3 and the ESD protection circuits 111 to 113 included in the respective chips C1 to C3 may not be used after the chips C1 to C3 are packaged, and the MUXs 161 to 163 may not output selected test signals TS1 to TS3 after packaging. Therefore, after the chips C1 to C3 are packaged, the selection signal generators 151 to 153 may not allow the MUXs 161 to 163 to output the selected test signals TS1 to TS3 in response to the chip control signal Scon applied from the test control circuit 180.

The final selection signal generator 154 outputs a final selection signal fsel to the interface MUX 164 in response to a final selection control signal Sconf applied from the test control circuit 180. After packaging, the chips C1 to C3 may not output the test signals Tsig11 to Tsig34 through the test pads TP1 to TP3 included in the respective chips C1 to C3, and thus the test signals Tsig11 to Tsig34 may be output through the interface chip IFC. The test signals Tsig11 to Tsig34 output from the chips C1 to C3 are applied to the interface MUX 164 through the transmission lines L21 to L24, and the interface MUX 164 selects one of the test signals Tsig11 to Tsig34 in response to the final selection signal fsel and outputs the output test signal TSF to the test interface pad TPF. In some cases, a buffer (not shown) may be additionally interposed between the transmission lines L21 to L24 and the interface MUX 164. When the test operation is not performed, the interface MUX 164 may not output the output test signal TSF in response to the final selection signal fsel. An interface ESD protection circuit 114 is interposed between the test interface pad TPF and the interface MUX 164, and the test interface pad TPF is electrically connected with an external test pin TPIN. The test pin TPIN may, for example, be further connected with an external device. Therefore, the output test signal TSF applied to the test interface pad TPF may be output externally.

In the above MCP semiconductor device of FIG. 2, the respective chips C1 to C3 are controlled by the test control circuit 180 to perform the test operation and output the test signals Tsig11 to Tsig34. Here, test signals are output from only one of the interfaces 131 to 133, and the MUXs 161 to 163 of the respective chips C1 to C3 do not output the selected test signals TS1 to TS3. The interface MUX 164 of the interface chip IFC receives the test signals Tsig11 to Tsig34 through the transmission lines L21 to L24, selects one of the test signals Tsig11 to Tsig34 in response to the final selection signal fsel output from the final selection signal generator 154, and outputs the output test signal TSF to the test pin TPIN through the interface ESD protection circuit 114 and the test interface pad TPF. Subsequently, the interface MUX 164 selects a next test signal in response to the final selection signal fsel and output the output test signal TSF. When all desired test signals output from one of the chips C1 to C3 are output, the interface corresponding to that chip does not further output any of the test signals. Instead, the interface of another chip may be activated and output test signals. The interface MUX 164 of the interface chip IFC may likewise select one of the test signals and output the output test signal TSF.

Since the MCP semiconductor device of FIG. 2 may output the test signals Tsig11 to Tsig34 externally through the test interface pad TPF, the test signals Tsig11 to Tsig34 may be tested after the chips C1 to C3 are packaged. In addition, the test signals Tsig11 to Tsig34 may not pass through the ESD protection circuits 111 to 113 included in the respective chips C1 to C3, and thus signal attenuation may be reduced. When the test operation is not performed, the test signals Tsig11 to Tsig34 may not pass through the interface ESD protection circuit 114 included in the interface chip IFC either. Furthermore, the number of test pads, test interface pads, ESD protection circuits, interface ESD protection circuits and test pins may be reduced according to example embodiments.

For convenience, it is illustrated in FIGS. 1 and 2 that each of the chips CH, C1 to C3 and IFC have only one of the test pads TP, TP1 to TP3 and TPF, and only one of the ESD protection circuits 110 to 114. However, the chips CH, C1 to C3 and IFC may have more than one test pad, ESD protection circuit and/or ESD protection circuit. Although not shown in the drawings, the respective chips CH and C1 to C3 and the interface chip IFC may have a pad and an ESD protection circuit for exchanging general signals.

Example embodiments may provide an MCP semiconductor device having ESD protection circuits, and a method of testing the semiconductor device. According to example embodiments, the number of test pads for testing various signals of an internal circuit and the number of the ESD protection circuits may be reduced and chip size may be reduced. In addition, when a test is not performed, signals may not pass through the ESD protection circuits, and thus characteristics of a signal may be improved and/or signal attenuation may be reduced. Furthermore, it may be possible to test various signals after the MCP semiconductor device is packaged.

Although the example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A semiconductor device including stacked chips, each stacked chip comprising:
a test circuit configured to output a test control signal, an interface control signal, and a selection control signal in response to a test enable signal;
a selection signal generator configured to output a selection signal in response to the selection control signal;
an internal circuit configured to perform an operation and output a plurality of test signals in response to the test control signal;
at least one multiplexer (MUX) configured to select and output one of the plurality of test signals based on the selection control signal and in response to the selection signal;
at least one test pad configured to receive the selected test signal;
at least one electrostatic discharge (ESD) protection circuit configured to discharge static electricity applied through the test pad externally; and
an interface configured to receive the plurality of test signals from the internal circuit and to one of drive and output the test signals and prevent the test signals from being output in response to the interface control signal.

2. The semiconductor device of claim 1, each of the stacked chips further comprising:
a plurality of transmission lines configured to electrically connect the stacked chips to at least one other chip.

3. The semiconductor device of claim 2, wherein the semiconductor device further includes an interface chip configured to receive the test signals applied from the stacked chips through the plurality of transmission lines and output the test signals externally.

4. The semiconductor device of claim 3, the interface chip comprising:
a test control circuit configured to output the test enable signal, a final selection control signal, and a chip control signal to control the selection signal generator of each of the stacked chips when the semiconductor device performs a test operation;
at least one interface MUX configured to select and output one of the test signals applied from the stacked chips through the plurality of transmission lines based on the final control selection signal;
at least one test interface pad configured to receive the selected test signal; and
at least one interface ESD protection circuit configured to discharge static electricity applied through the test interface pad externally.

5. The semiconductor device of claim 4, the interface chip further comprising:
a final selection signal generator configured to output a final selection signal in response to the final selection control signal, wherein
the at least one interface MUX is configured to select and output one of the test signals applied from the stacked chips through the plurality of transmission lines in response to the final selection signal.

6. The semiconductor device of claim 4, wherein the interface chip sequentially activates only one of the interfaces of the stacked chips to receive the outputted test signals, with the interfaces of the other stacked chips being deactivated.

7. The semiconductor device of claim 4, the interface chip further comprising:
a plurality of buffers configured to buffer the test signals applied through the plurality of transmission lines and output the plurality test signals to the at least one interface MUX.

8. The semiconductor device of claim 4, the interface chip further comprising:
at least one test pin electrically connected with the test interface pad to output the test signal applied to the test interface pad externally.

9. The semiconductor device of claim 4, wherein the at least one test interface pad corresponds to the at least one interface MUX and the at least one interface ESD protection circuit is between the at least one interface MUX and the at least one test interface pad.

10. The semiconductor device of claim 1, each of the stacked chips further comprising:
a plurality of buffers configured to buffer the test signals applied through the interface and output the test signals to the at least one MUX.

11. The semiconductor device of claim 1, each of the stacked chips further comprising:
at least one test pin electrically connected with the at least one test pad to output the selected test signal applied to the test pad externally.

12. The semiconductor device of claim 1, wherein the semiconductor device is at least one of a semiconductor memory device and a stack-type semiconductor device.

13. The semiconductor device of claim 1, wherein the at least one test pad corresponds to the at least one MUX and the at least one ESD protection circuit is between the at least one MUX and the test pad.

14. A method of testing a semiconductor device including one or more chips, each of the chips including a test circuit, an internal circuit, at least one multiplexer (MUX) and at least one electrostatic discharge (ESD) protection circuit, the method comprising:
generating a test control signal, a selection control signal, and an interface control signal via the test circuit, in response to a test enable signal;
performing an operation via the internal circuit, in response to the test control signal and outputting a plurality of test signals;
receiving, driving, and outputting the test signals based on the interface control signal;
selecting, after the receiving, driving, and outputting, at least one of the test signals via the at least one MUX, in response to the selection control signal;
outputting the selected test signal; and
transmitting the selected test signal to at least one test pad through the at least one ESD protection circuit.

15. The method of claim 14, wherein the selecting further includes,
generating a selection signal in response to the selection control signal, and
selecting and outputting one the test signals in response to the selection signal.

16. The method of claim 14, further comprising:
generating the test enable signal and a chip control signal in response to a test command applied externally;
preventing the plurality of test signals from at least one of the chips from being applied to the respective ESD protection circuit and the test pad in response to the chip control signal;
receiving a plurality of the test signals from one of the one or more chips, selecting at least one of the test signals, and outputting the finally selected test signal; and transmitting the finally selected test signal to a test interface pad through at least one of the interface ESD protection circuits.

17. The method of claim 16, wherein the preventing further includes preventing the plurality of test signals from at least one of the chips from being applied to the respective ESD protection circuit and the test pad in response to the interface control signal.

18. The method of claim 16, wherein the receiving further includes buffering and outputting the driven test signals from one of the one or more chips.

19. The method of claim 16, wherein the receiving further includes,
   generating a final selection control signal,
   generating a final selection signal to select one of the test signals in response to the final selection control signal, and
   selecting and outputting one of the plurality of test signals in response to the final selection signal.

* * * * *